United States Patent
Miranda et al.

(10) Patent No.: US 8,402,241 B2
(45) Date of Patent: Mar. 19, 2013

(54) METHOD AND APPARATUS TO CONTROL ACCESS TO DEVICE ENABLE FEATURES

(75) Inventors: Paul C. Miranda, Austin, TX (US); Kenneth Alan House, Arlington, MA (US); Charles K. Bachand, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 388 days.

(21) Appl. No.: 11/866,211

(22) Filed: Oct. 2, 2007

(65) Prior Publication Data
US 2009/0089529 A1 Apr. 2, 2009

(51) Int. Cl.
*G06F 12/00* (2006.01)
(52) U.S. Cl. .................. 711/164; 711/103; 711/104
(58) Field of Classification Search .......... 711/103, 711/163, 164; 726/27
See application file for complete search history.

(56) References Cited

U.S. PATENT DOCUMENTS

| | | | | |
|---|---|---|---|---|
| 4,748,594 A | * | 5/1988 | Iida | 365/200 |
| 5,671,281 A | * | 9/1997 | Campbell et al. | 713/100 |
| 6,385,688 B1 | * | 5/2002 | Mills et al. | 711/103 |
| 6,415,371 B1 | * | 7/2002 | Nakamura et al. | 711/164 |
| 6,525,955 B1 | * | 2/2003 | Smith et al. | 365/96 |
| 7,032,092 B2 | * | 4/2006 | Lai | 711/167 |
| 7,111,165 B2 | * | 9/2006 | Liden et al. | 713/170 |
| 7,274,283 B2 | * | 9/2007 | Yosim et al. | 340/5.74 |
| 2004/0015939 A1 | * | 1/2004 | Cheah et al. | 717/168 |
| 2004/0193818 A1 | * | 9/2004 | Hashimoto et al. | 711/164 |
| 2004/0243993 A1 | * | 12/2004 | Okonnen et al. | 717/168 |
| 2004/0255145 A1 | * | 12/2004 | Chow | 713/200 |
| 2006/0015864 A1 | * | 1/2006 | Kang | 717/173 |
| 2007/0157000 A1 | * | 7/2007 | Qawami et al. | 711/170 |

* cited by examiner

*Primary Examiner* — Reginald G. Bragdon
*Assistant Examiner* — Gurtej Bansal
(74) *Attorney, Agent, or Firm* — Zagorin O'Brien Graham LLP

(57) ABSTRACT

An integrated circuit device includes a first plurality of non-volatile memory locations such as fuses that supply programmed values corresponding to initially selected device features such as voltage, frequency, clock speed, and cache parameters. The device is programmed with a lock value in a second plurality of non-volatile memory locations. That lock value may be a randomly generated number that is unique for each device. After initial programming of the device, access to the device is prevented by appropriately programming access control. In order to unlock the device and modify device features, an unlock key value is supplied to the device. If the unlock key value correctly corresponds to the lock value, the device features can be modified. In that way device features can be modified, but security is maintained to prevent unauthorized modification to device features.

17 Claims, 4 Drawing Sheets

US 8,402,241 B2

METHOD AND APPARATUS TO CONTROL ACCESS TO DEVICE ENABLE FEATURES

BACKGROUND

1. Field of the Invention

This application relates to controlling device enable features in devices such as microprocessors and more particularly to modifying programmed features after initial programming.

2. Description of the Related Art

In microprocessors, various features of the microprocessor relating, e.g., to voltage levels, clock frequencies, caches, interface speeds and widths, and other device capabilities and tuning and calibration parameters are fused at the end of the manufacturing process. The selection of the device features often determines the market into which a processor is sold, e.g., home computer or servers.

SUMMARY

According to an embodiment of the present invention, devices such as microprocessors can have their fuse settings changed after initial fusing to allow the devices to be retargeted for different markets and/or to allow correction for devices that were fused incorrectly, or to work around defective fuses, while at the same time significantly reducing the risk that unauthorized and/or undesired reprogramming of the fuses takes place.

Accordingly, in one embodiment, a method is provided that includes initially selecting device features for a device by programming a plurality of first non-volatile memory locations, e.g., fuses, in a device such as a microprocessor. A lock value is stored in second non-volatile memory locations in the device. After access control is restricted by appropriately setting non-volatile memory locations, modification of the device features initially selected is prevented, unless a key value that correctly corresponds to the lock value is supplied to the device. The method may further include, on supplying the device with the key value corresponding to the lock value, enabling changing one or more of the initially selected device features and changing one or more of the initially selected device features by programming a plurality of third non-volatile memory locations. In an embodiment, a selector circuit supplies values from the third non-volatile memory locations instead of the first non-volatile memory locations in order to change the device features. In another embodiment, values from the third non-volatile memory locations are logically combined, e.g., XORd, with values from the first non-volatile memory locations.

In another embodiment, an integrated circuit is provided that includes a first plurality of non-volatile memory locations supplying programmed values corresponding to initially selected device features. A second plurality of non-volatile memory locations stores a lock value. A key register stores a key value. Compare logic compares the lock and key values and enables modifying one or more of the device features according to a result of the comparison.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
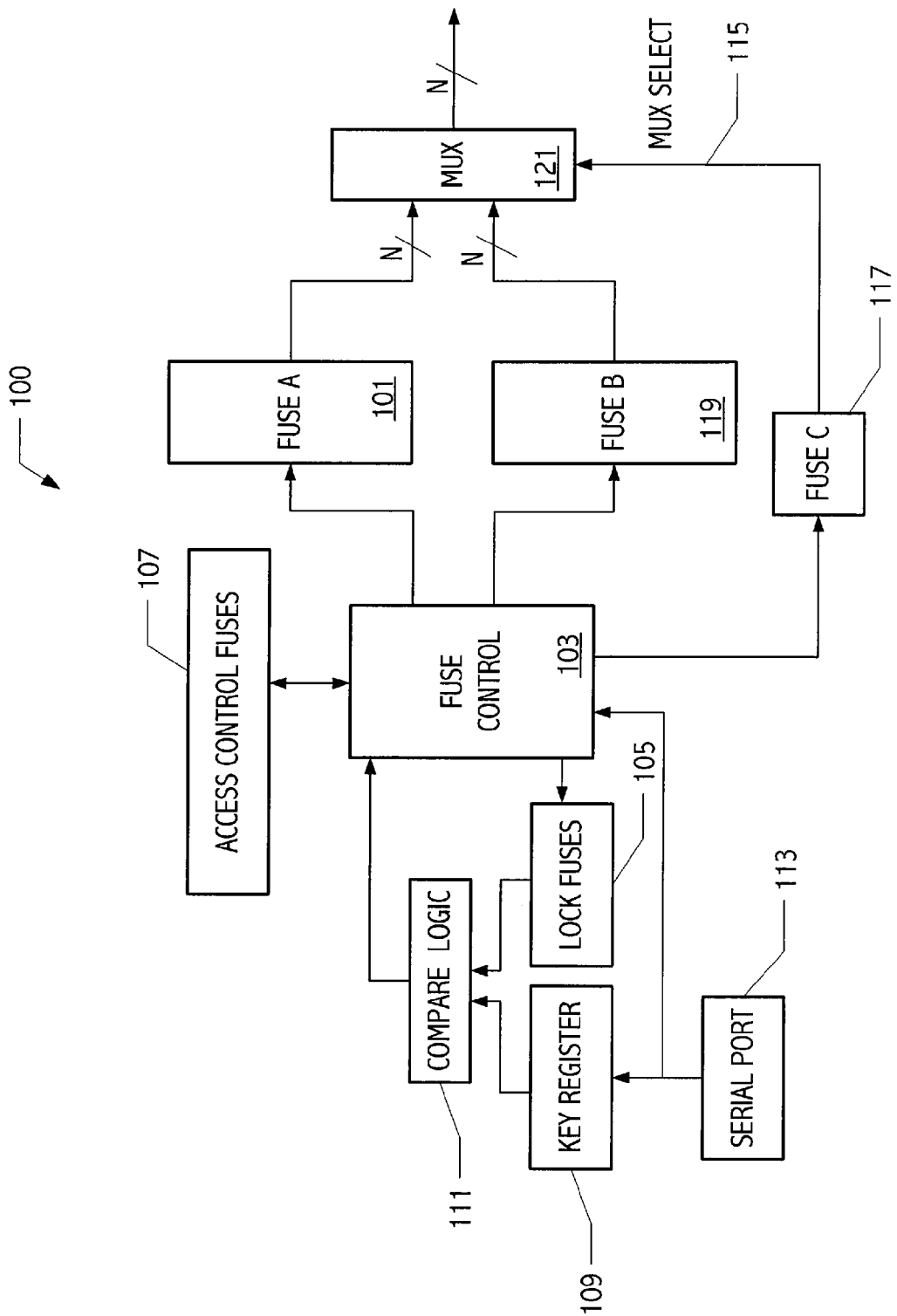
FIG. 1 illustrates a high level block diagram of an architecture relating to device enable features of a microprocessor according to an embodiment of the invention.

Referring to FIG. 1, illustrated is an exemplary fuse structure 100 for an integrated circuit such as a microprocessor that allows device settings to be initially set and then changed in a secure manner. A block of fuses 101 (Fuse A) is initially programmed under control of fuse control circuitry 103. The block may have hundreds of fuses. The fuse control circuitry is conventional and allows an appropriate current to be applied so as to program a fuse element that may be formed of polysilicon or other material. The fuse is programmed by, e.g., melting the fuse material so as to create an electrical open circuit between fuse terminals. Note that while fuses are described herein in the exemplary embodiment, antifuses or other electrically alterable non-volatile storage technology known in the art may be utilized.

The fuses set a variety of device parameters. For example, voltage levels utilized by the device, device clock speed, cache size, bus width, and a wide variety of other device features may be programmed through setting fuses to an appropriate value. In an embodiment, the fuses are initially a logical zero. Where desired, the fuses are programmed to a logical one. The ability to unlock the part and allow further programming allows those initial values to be changed. Once the fuses 101 are programmed appropriately, a lock value is programmed into the lock fuse location 105. The programmed lock value controls future access to modify the initially programmed device features. Once the lock value is programmed into fuse location 105, access control fuse(s) 107 may be programmed to prevent access to change the fuse settings without the appropriate unlock key. Multiple access control fuses may be provided so that after each unlock and modification of the device settings, access can be locked again. Note that programming the lock value fuses may serve as an access control lock. A final lock fuse (or fuses) can be provided in the access control fuses 107 (or elsewhere) that irreversibly locks the device against any future feature changes.

In order to enable changing the initially programmed device features, an unlock key that corresponds to the lock value is supplied to the device. In an embodiment, the lock value is a randomly generated number, unique to each processor. In a preferred embodiment, the value chosen for the lock stored in fuse location 105 comes from a high quality (unpredictable) random number generator source. The random number source generates unique random numbers for the microprocessors limited by the number of values available for the lock value. A few of the potential lock values may be reserved. A database stores the random number assigned to a particular processor. In an embodiment, the random numbers are one-time-pad random numbers. In another embodiment, pseudo-random numbers may be used, but that can result in reduced security. Each processor has a unique identification number, and the random number associated with enabling modification of device features can be accessed in the database based on the processor ID or some other uniquely identifying indicia.

The length of the lock value may be chosen based on a number of factors. For example, one factor that may be utilized is how long it would take to execute a brute force attack in which guessed values are loaded in an attempt to unlock the processor. Another criterion for lock value length is the economic value of the device. That is, the lock value length may be chosen so that the cost to break the lock exceeds the value added by re-fusing the device. For example, a lock value length can be chosen so that a brute force attack takes more than 18 months per part. Further, various approaches can be used to limit the speed of the attack. For example, the register used to load the key value can be placed within a serial access mechanism where other values surround it. In addition, the speed at which the key register can be accessed can be reduced. Further, the number of unlock attempts can be limited. For example, each failed write to the key register (mismatch between lock and key) can result in one or more non-volatile memory locations being programmed. Once a predetermined limit is reached, additional unlock attempts are prohibited. Another embodiment counts failed matches between lock and key in a volatile counter and ignores attempts to write the key register after a limit has been exceeded, requiring a power cycle to reset the counter. Use of the volatile counter can provide a simpler implementation as compared to counting in a non-volatile counter (e.g., a thermometer counter). Unlock attempts can be prevented by, e.g., disabling writes to the key register.

Note that the lock fuse location 105 is not normally readable after the device has been locked and may be located in a physical location on the integrated circuit that makes it hard to physically access. That can help make reverse engineering the part to access the fuses and obtaining or modifying the programmed lock value more difficult.

An exemplary lock length (L) can be determined as follows. Assume a time to attempt one attack of 1 millisecond, and an allowable average brute force attack (say half the time to attempt all the possible keys) of 18 months. $2^L/2=18$ (months)*30 (days)*24 (hours)*60 (minutes)*60 (seconds)*1000 (milliseconds)=$4.6656*10^7$, so L=$\log 2(9.3312*10^7)$=36.4, round up to 37 bits.

Referring still to FIG. 1, assume that fuse locations Fuse A 101 have been programmed, the lock value has been programmed into lock fuse location 105 and the access control fuse(s) 107 have been programmed to prevent unauthorized feature changes. In order to change device features, the appropriate unlock key has to be supplied to the key register 109. In an embodiment, a serial port 113 is used to shift the key value into key register 109. The value chosen for the key value may be identical to the programmed lock in lock fuse location 105 or some other function, e.g., a hash or other cryptographic transformation of the stored number. In a straightforward embodiment, the key value written into the key register is identical to, or the complement of, the value stored in the lock location 105. Compare logic 111 compares to see if the key value in the key register 109 corresponds appropriately to the lock value (e.g., matches the lock) and if so, supplies a signal to the fuse control logic 103 to enable additional programming to modify device features. Note that the compare logic can be more complex than a simple bit-wise comparison. For example, the compare logic can implement a hash function or other cryptographic algorithm on either the fused lock value, the unlock key value in the key register, or both, to determine if programming access should be granted. Other data on the part may also participate in the comparison, by adding match bits or selecting a different compare algorithm.

In one embodiment, once programming access has been granted, fuse B location 119 may be programmed to alter the device features. Thus, the desired fuse values may be programmed into fuse B 119 through fuse control 103. Note that only certain of the device features may be available to be reprogrammed. In one embodiment, the device features are programmed into fuse B 119, and the access control fuses 107 are again programmed to lock access to prevent additional programming of device features. In an embodiment, the new device features are made available by programming fuse C location 117, which may be one or more fuses and using selector circuit 121 to select the values from fuse B 119 instead of fuse A 101. Note that while a single multiplexer select line and multiplexer is shown in FIG. 1, additional multiplexers controlled by the same or different multiplexer select lines having values determined according to non-volatile memory location(s) may be utilized. Note also that while fuse C 117 is shown as separate from fuses A and B, they may in fact be a part of fuse location A and/or B.

Figure 2:
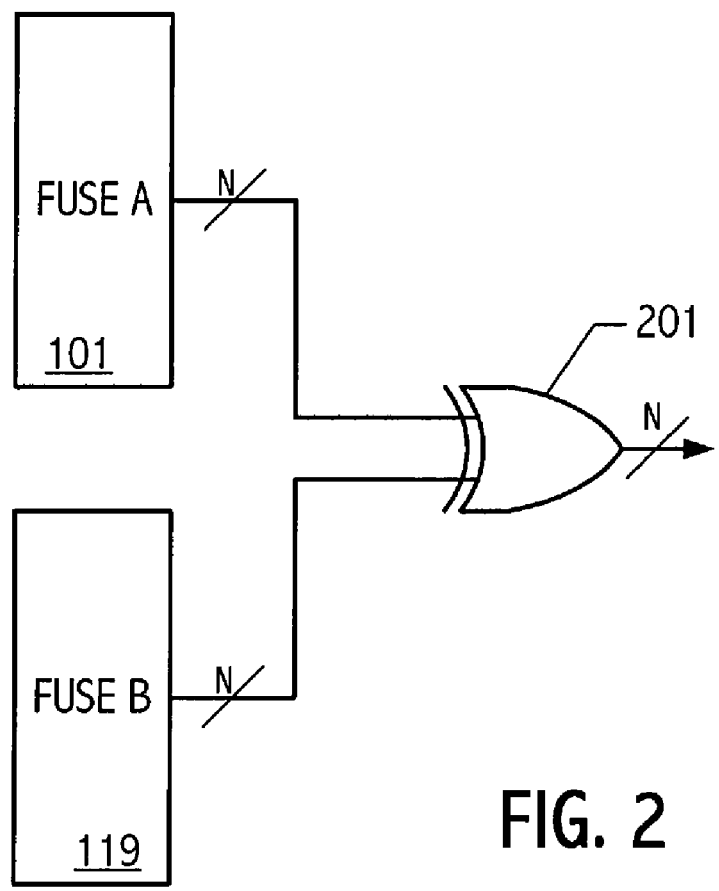
FIG. 2 illustrates an exemplary embodiment of how a device feature can be changed using a second group of fuses.

In another embodiment illustrated in FIG. 2, the fuse A programming may be altered by logically combining fuse B 119 in, e.g., exclusive OR gates 201. That embodiment has the advantage of eliminating fuse C 117, the selector circuit 121, and the multiplexer select line 115. In an embodiment, unprogrammed fuses in fuse location A may be programmed once modifications are enabled by supplying the unlock key. That programming may be instead of, or in addition to programming fuse B values.

Figure 3:
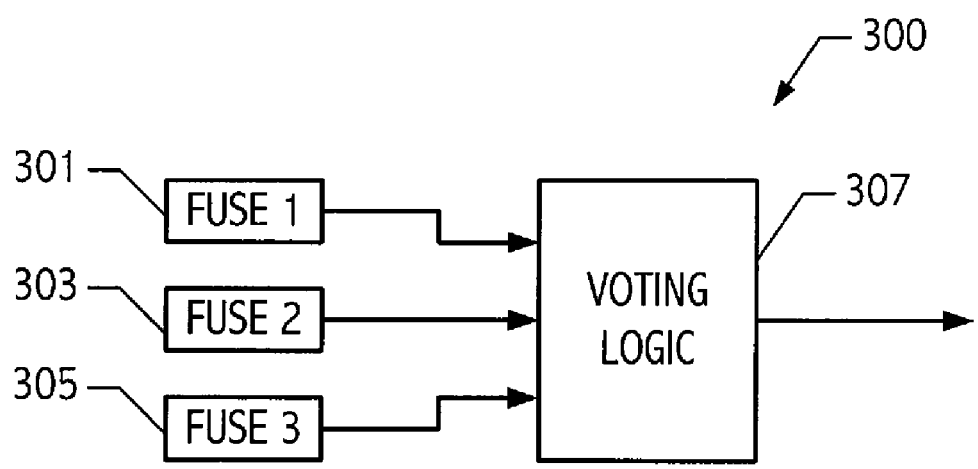
FIG. 3 illustrates an exemplary logical fuse structure that includes multiple physical fuses.

Referring to FIG. 3, in an embodiment, one or more of the fuses A, B, C and the lock value may be formed as logical fuse 300, which is formed of multiple physical fuses, e.g., physical fuses 301, 303, and 305. Voting logic 307, coupled to the three physical fuses, determines the output of logical fuse 300. The voting logic may implement a majority voting scheme to determine the output of the logical fuse. That reduces the chance of a single failed physical fuse causing the device feature to be programmed incorrectly or preventing reprogramming the device at all due to a physical fuse error.

Figure 4A:
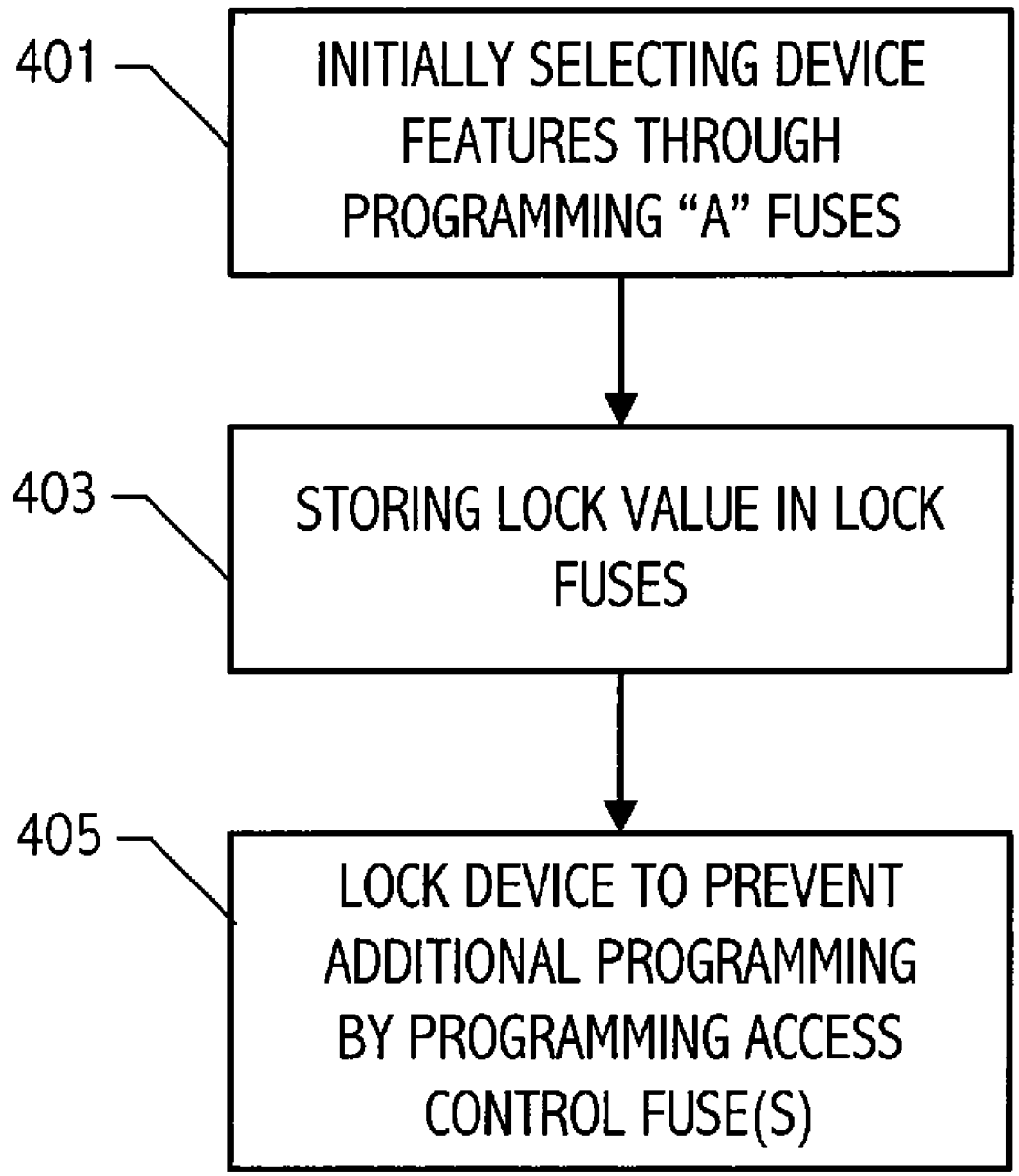
FIG. 4A illustrates a flow diagram of an exemplary embodiment of initial programming.
Figure 4B:
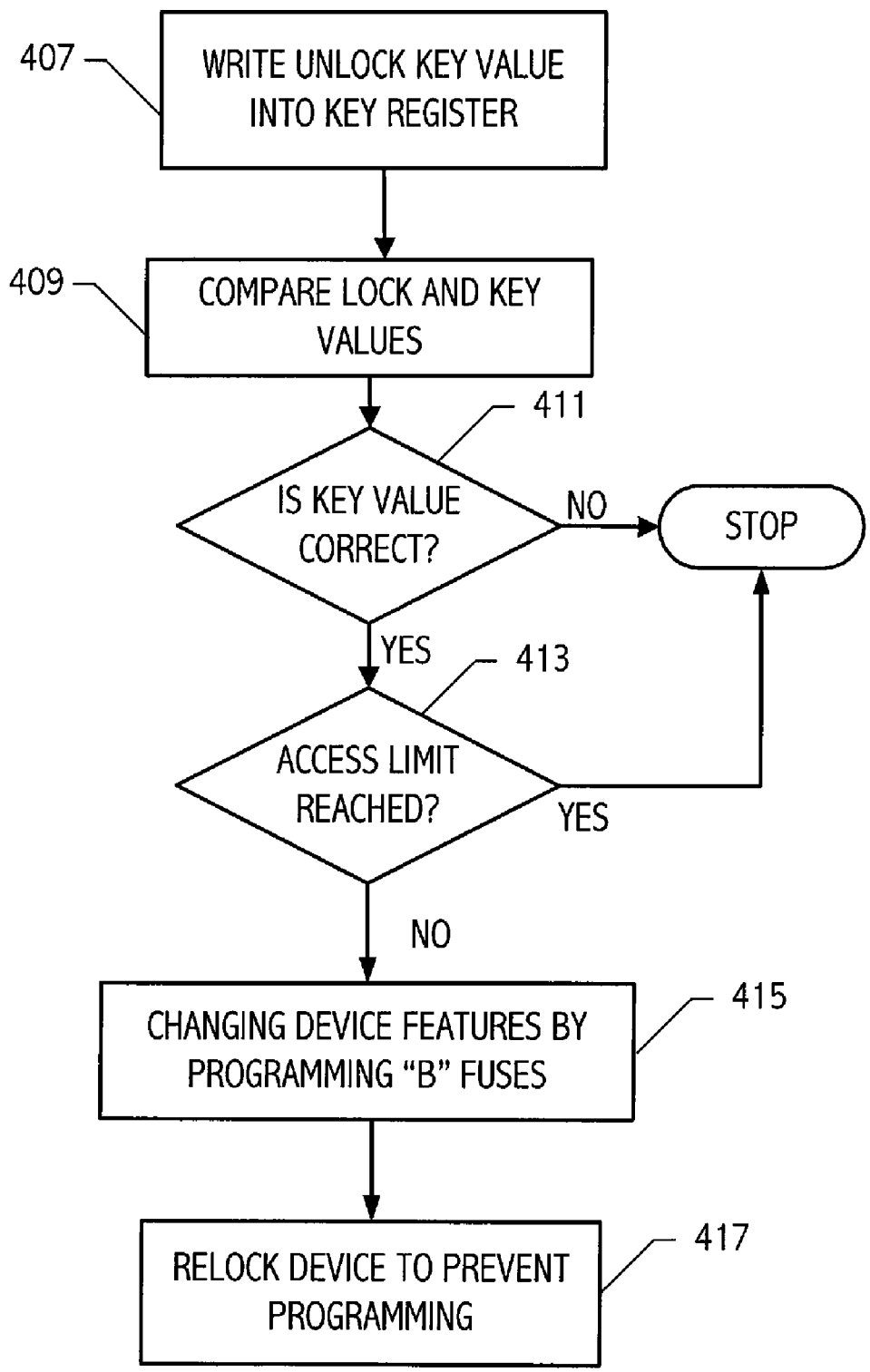
FIG. 4B illustrates a flow diagram of an exemplary embodiment of a re-fusing operation.

An overall flow of various aspects of an embodiment of the present invention is illustrated in FIGS. 4A and 4B. FIG. 4A illustrates initial programming of the device and FIG. 4B illustrates a reprogramming or re-fusing operation. In 401 device features are initially selected by programming a first set of fuses ("A" fuses). Note that in embodiments using a selector circuit 121, the C fuses are also programmed to select the A fuses. That may be their default value without programming. In 403 a lock value is stored in the lock fuses. Then the microprocessor is locked in 405 to prevent additional programming by appropriately programming the access control fuses.

Referring now to FIG. 4B, in order to enable reprogramming device features, an appropriate unlock key value is written into the key register in 407. A comparison is made in 409 and 411 between the programmed lock value and the key value. If the key value is correct, then in an embodiment an access limit is checked in 413 to see if a limited number of allowed accesses to the key register has been exceeded. Of course, the access limit may be checked prior to evaluation of the key value. The access limit may limit the number of failed writes to the key register (i.e., the key did not match the lock), the number of total writes to the key register, or some combination of the two. If the key value is correct and the access limit has not been reached (or there may be no access limit in other embodiments), the device features are changed in 415 by programming a different block of fuses which may then be selected instead of, or logically combined with the A fuses to alter device features. If necessary, the C fuses are programmed to appropriately control the selector circuit selecting either fuses A or fuses B. After that the device is relocked in 417 to prevent further programming of device features. In an embodiment, a final lock may be implemented to irreversibly prevent any further modification of device features.

The description of the invention set forth herein is illustrative, and is not intended to limit the scope of the invention as set forth in the following claims. Other variations and modifications of the embodiments disclosed herein may be made based on the description set forth herein, without departing from the scope and spirit of the invention as set forth in the following claims.

What is claimed is:

1. A method comprising:
   initially selecting device features for a device by programming a plurality of first non-volatile memory locations;
   storing a lock value in second non-volatile memory locations in the device;
   preventing modification of the device features initially selected, absent a key value being supplied to the device that correctly corresponds to the lock value;
   supplying the device with the key value that correctly corresponds to the lock value;
   changing one or more of the initially selected device features after receipt by the device of the key value correctly corresponding to the lock value and wherein changing the one or more of the initially selected device features further comprises programming a plurality of third non-volatile memory locations; and
   logically combining one or more values stored in the third non-volatile memory locations with one or more other values stored in the first non-volatile memory locations, to change the one or more of the initially selected device features, the logically combining being bitwise Boolean operations.

2. The method as recited in claim 1, further comprising programming one or more unprogrammed memory locations in the first non-volatile memory locations after supplying the key value that correctly corresponds to the lock value.

3. The method as recited in claim 1, further comprising irreversibly locking the device to prevent changing of device features after at least one change to device features is completed.

4. The method as recited in claim 1, further comprising programming a programmable non-volatile memory location to a predetermined value to prevent changing the initially selected device features absent the key value correctly corresponding to the lock value.

5. The method as recited in claim 1 wherein the non-volatile memory locations comprise fuses.

6. The method as recited in claim 1, further comprising enabling changing one or more of the initially selected device features when the lock and key values are equal.

7. The method as recited in claim 1, further comprising:
   programming a plurality of processors, including the device, with different random number lock values;
   supplying at least a subset of the processors with respective key values that correspond to respective random number lock values; and
   subsequently changing device features in the subset.

8. The method as recited in claim 1 wherein the device features include at least one of voltage levels utilized by the device, device clock speed, cache size, and bus width.

9. An integrated circuit comprising:
   a first plurality of non-volatile memory locations for supplying programmed values corresponding to initially selected device features;
   a second plurality of non-volatile memory locations for storing a lock value;
   a key register for storing a key value;
   compare logic to compare the lock and key values and enable modifying one or more of the device features according to a result of the comparison;
   a third plurality of non-volatile memory locations supplying programmed values to change one or more of the initially selected device features; and
   respective logic circuits coupled to the first and third non-volatile memory locations to supply values to change one or more of the initially selected device features by logically combining, using Boolean logic, respective values supplied by the first and third non-volatile memory locations.

10. The integrated circuit as recited in claim 9 wherein the modification of the one or more of the device features is enabled if the lock and key values are equal.

11. The integrated circuit as recited in claim 9 wherein the first, second, and third plurality of non-volatile memory locations are comprised of fuses.

12. The integrated circuit in claim 11, wherein one or more of the first, second and third plurality of non-volatile memory locations includes logical fuses, each of the logical fuses including a plurality of physical fuses and voting logic coupled to the physical fuses to supply a value according to a majority of values of the physical fuses.

13. The integrated circuit as recited in claim 9, further comprising one or more programmable access control non-volatile memory locations that when programmed to a predetermined value, lock the integrated circuit, thereby preventing changing the initially selected device features absent the key value correctly corresponding to the lock value.

14. The integrated circuit as recited in claim 9 further comprising at least one fuse location that when programmed to a predetermined value is configured to prevent any additional modification of device features.

15. The integrated circuit as recited in claim 9, wherein modification of device features is prohibited after a predetermined number, greater than one, of invalid keys is received.

16. A method comprising:
   initially selecting device features for a device by programming a plurality of first non-volatile memory locations to determine the initially selected device features;
   storing a lock value in second non-volatile memory locations in the device;
   preventing modification of the device features initially selected, absent a key value being supplied to the device that correctly corresponds to the lock value;
   supplying the device with the key value that correctly corresponds to the lock value;
   changing one or more of the initially selected device features after receipt by the device of the key value correctly corresponding to the lock value and wherein changing the one or more of the initially selected device features further comprises programming a plurality of third non-volatile memory locations; and
   controlling a multiplexer circuit from one or more fourth non-volatile memory locations to supply values from the third non-volatile memory locations instead of the first non-volatile memory locations to thereby change the one or more of the initially selected device features.

17. An integrated circuit comprising:

a first plurality of non-volatile memory locations for supplying programmed values corresponding to initially selected device features;

a second plurality of non-volatile memory locations for storing a lock value;

a key register for storing a key value;

compare logic to compare the lock and key values and enable modifying one or more of the device features according to a result of the comparison;

a third plurality of non-volatile memory locations supplying programmed values to change one or more of the initially selected device features;

a multiplexer circuit coupled to receive one or more values from the first non-volatile memory locations and one or more values from the third non-volatile memory locations and to supply the one or more values from the first non-volatile memory locations to select a corresponding one or more of the initially selected device features and to supply the one or more values from the third non-volatile memory locations to change one or more of the initially selected device features; and one or more fourth non-volatile memory locations coupled to supply one or more control values to control the multiplexer circuit to supply the one or more values from one of the first and third non-volatile memory locations.

* * * * *